(12) United States Patent
Kim

(10) Patent No.: US 9,824,776 B1
(45) Date of Patent: Nov. 21, 2017

(54) SEMICONDUCTOR MEMORY DEVICE AND WEAK CELL DETECTION METHOD THEREOF

(71) Applicant: SK hynix Inc., Gyeonggi-do (KR)

(72) Inventor: Youk-Hee Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/299,157

(22) Filed: Oct. 20, 2016

(30) Foreign Application Priority Data

May 17, 2016 (KR) .......................... 10-2016-0060016

(51) Int. Cl.
*G11C 7/00* (2006.01)
*G11C 29/00* (2006.01)
*G11C 29/40* (2006.01)
*G11C 11/4091* (2006.01)
*G11C 11/406* (2006.01)
*G11C 11/408* (2006.01)
*G11C 11/4093* (2006.01)

(52) U.S. Cl.
CPC ............ *G11C 29/40* (2013.01); *G11C 11/406* (2013.01); *G11C 11/4085* (2013.01); *G11C 11/4091* (2013.01); *G11C 11/4093* (2013.01)

(58) Field of Classification Search
CPC ... G11C 29/40; G11C 11/4091; G11C 11/406; G11C 11/4085; G11C 11/4093
See application file for complete search history.

(56) References Cited

U.S. PATENT DOCUMENTS

| 2010/0128540 | A1* | 5/2010 | Kim ...................... G11C 29/40 365/189.08 |
| 2014/0157066 | A1* | 6/2014 | Johnson ................. G11C 29/40 714/719 |
| 2014/0301149 | A1* | 10/2014 | Hsu ........................ G11C 29/14 365/201 |
| 2015/0012791 | A1* | 1/2015 | Kim ................. G01R 31/31716 714/744 |
| 2016/0155490 | A1* | 6/2016 | Shin .................... G11C 11/4085 365/203 |

FOREIGN PATENT DOCUMENTS

| KR | 1020070004333 | 1/2007 |
| KR | 1020100076812 | 7/2010 |
| KR | 1020160063726 | 6/2016 |

* cited by examiner

*Primary Examiner* — Toan Le
(74) *Attorney, Agent, or Firm* — IP & T Group LLP

(57) ABSTRACT

A semiconductor memory device includes: a plurality of memory blocks; a plurality of bit-line sense amplifiers shared by neighboring memory blocks among the plurality of the memory blocks, and suitable for sensing and amplifying data read from memory cells coupled to activated word lines through bit lines, and outputting the amplified data through a plurality of segment data lines; a word line driver suitable for activating word lines of memory blocks that do not share the bit-line sense amplifiers during a test mode; and a weak cell detection circuit suitable for compressing the amplified data transferred through the plurality of the segment data lines for generating compressed data and detecting a weak cell based on the compressed data during the test mode.

19 Claims, 10 Drawing Sheets

SEMICONDUCTOR MEMORY DEVICE AND WEAK CELL DETECTION METHOD THEREOF

CROSS-REFERENCE TO RELATED APPLICATIONS

The present application claims priority of Korean Patent Application No. 10-2016-0060016, filed on May 17, 2016, which is Incorporated herein by reference in its entirety.

BACKGROUND

1. Field

Exemplary embodiments of the present invention relate generally to a semiconductor designing technology, and more particularly, to a method for detecting a weak cell in a semiconductor memory device.

2. Description of the Related Art

Each memory cell of a semiconductor memory device, such as a dynamic random access memory (DRAM) device, generally includes a capacitor for storing data in the form of charges and a transistor functioning as a switch for controlling the flow of charges to and from the capacitor. Whether a data is in a 'high logic' level (i.e., logic '1') or a 'low logic' level (i.e., logic '0') is decided based on whether the capacitor stores the charges or not, in other words, whether the terminal voltage of the capacitor is high or low.

The retention of data simply signifies a state in which accumulated charges are maintained in a capacitor. Theoretically, power is not consumed in this state. However, due to a leakage current caused by a PN junction of a MOS transistor, the initial amount of charges stored in a capacitor may be substantially reduced and or completely disappear. Hence, the data stored in the capacitor may be lost without supplementing the stored charges. To protect the data from being lost, the data of the memory cell has to be read before the data gets lost so as to produce read information, and then the capacitor has to be re-charged according to the read information to keep the initial amount of charges. This operation has to be performed periodically to retain the data, and is called a 'refresh operation.'

The refresh operation is performed whenever a refresh command is inputted into a memory from a memory controller. The memory controller inputs a refresh command to the memory at a predetermined cycle taking into consideration a data reference retention time of the memory. For example, when it is assumed that the data retention time of a memory is approximately 64 ms and all the memory cells of a memory device may be refreshed in response to approximately 8000 refresh commands, the memory controller has to input the refresh command to the memory device 8000 times within approximately 64 ms.

Meanwhile, when the individual data retention times of weak memory cells included in a memory device is less than the reference retention time of the device, data errors may occur in the weak cells of the memory device, and thus, the memory device including the weak memory cells should be detected and abandoned.

Without an accurate test for detecting the weak memory cells in a semiconductor memory device, the reliability of the semiconductor memory device is damaged. Also, generally, reliability problems due to weak memory cells may worsen as memory cell density increases. For this reason, recently, both academia and industry research has been directed in developing diverse schemes for detecting and screening the weak cells in memory devices.

SUMMARY

Embodiments of the present invention are directed to a semiconductor memory device in which weak cells can be detected through a test operation at a high speed.

In accordance with an embodiment of the present invention, a semiconductor memory device includes: a plurality of memory blocks; a plurality of bit-line sense amplifiers shared by neighboring memory blocks among the plurality of the memory blocks, and suitable for sensing and amplifying data read from memory cells coupled to activated word lines through bit lines, and outputting the amplified data through a plurality of segment data lines; a word line driver suitable for activating word lines of memory blocks that do not share the bit-line sense amplifiers during a test mode; and a weak cell detection circuit suitable for compressing the amplified data transferred through the plurality of the segment data lines for generating compressed data and detecting a weak cell based on the compressed data during the test mode.

In accordance with another embodiment of the present invention, a semiconductor memory device includes: a plurality of memory blocks; a plurality of bit-line sense amplifiers shared by neighboring memory blocks among the plurality of the memory blocks, and suitable for sensing and amplifying data read from memory cells coupled to activated word lines through bit lines, and outputting the amplified data as first amplified data through a plurality of segment data lines; a plurality of local sense amplifiers each suitable for sensing and amplifying a corresponding one of the first amplified data transferred through a corresponding one of the plurality of the segment data lines, and outputting the amplified first amplified data as second amplified data through a plurality of local data lines; a word line driver suitable for activating word lines of memory blocks that do not share the bit-line sense amplifiers during a test mode; and a plurality of weak cell detectors corresponding to the plurality of the bit-line sense amplifiers, respectively, wherein each of the plurality of the weak cell detectors compresses the corresponding one of the first amplified data transferred through the corresponding one of the plurality of the segment data lines from a corresponding one of the plurality of bit-line sense amplifiers for generating and output a compressed data to a corresponding one among the plurality of the local data lines during the test mode.

In accordance with yet another embodiment of the present invention, a method for detecting a weak cell in a semiconductor memory device which includes a plurality of memory blocks and a plurality of bit-line sense amplifiers shared by neighboring memory blocks among the plurality of the memory blocks includes: activating word lines of memory blocks that do not share the bit-line sense amplifiers among the plurality of the memory blocks; sensing and amplifying data transferred from memory cells coupled to the activated word lines through bit lines, and outputting the amplified data through a plurality of segment data lines; and compressing the amplified data transferred through the plurality of the segment data lines for generating compressed data and detecting a weak cell based on the compressed data.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
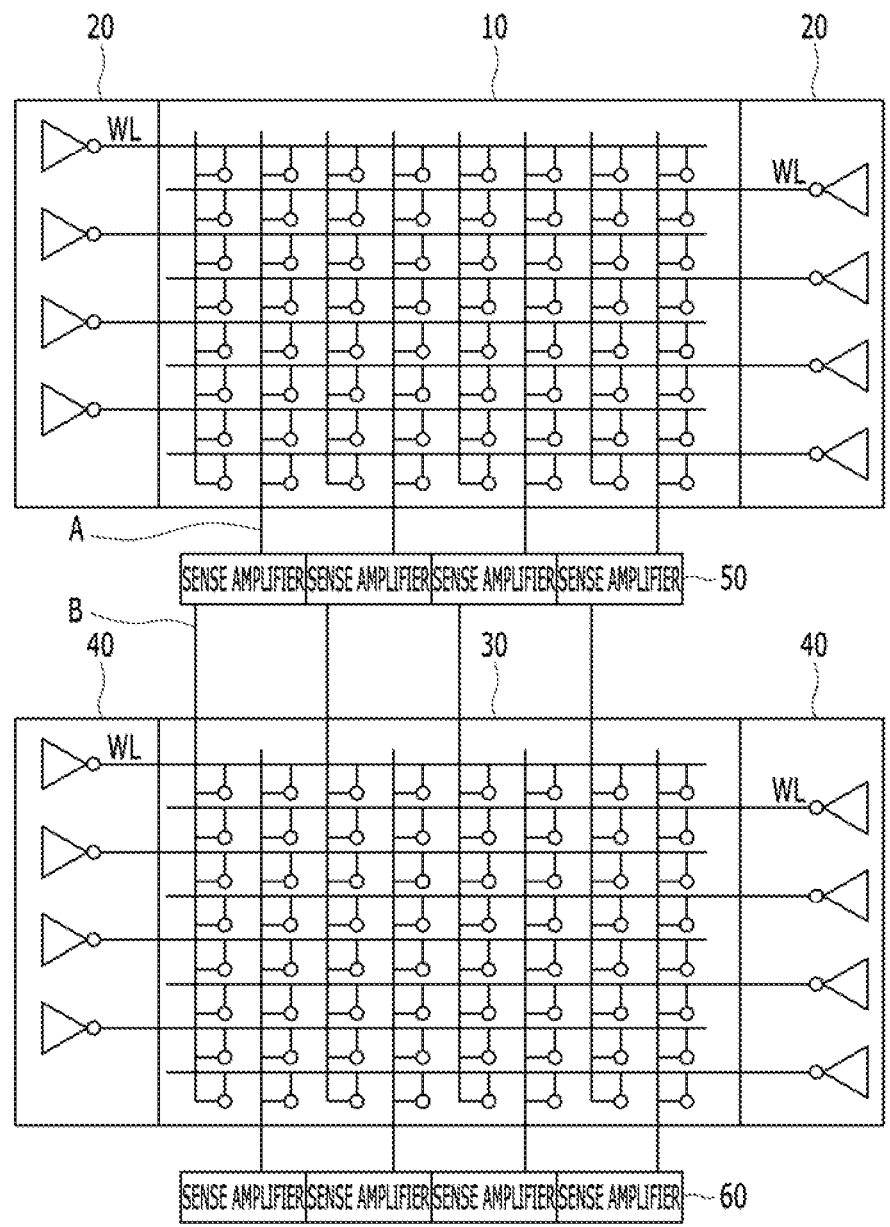
FIG. 1 illustrates a semiconductor memory device employing an open bit-line structure.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Semiconductor memory devices such as a Double Data Rate Synchronous Dynamic Random Access Memory (DDR SDRAM) include a great number of memory cells, and as the integration degree of semiconductor memory devices increases rapidly, the number of the memory cells is increasing as well. The memory cells form a memory cell array (also referred to as memory matrix) where the memory cells are arranged regularly in rows and columns.

FIG. 1 illustrates a semiconductor memory device employing an open bit-line structure.

The memory cell structures of semiconductor memory devices may be largely classified into a folded bit-line structure and an open bit-line structure.

The folded bit-line structure is a structure where a bit line to which data are applied (which is referred to as a driving bit line, hereafter) and a bit line that becomes a reference during an amplification operation (which is referred to as a reference bit line, hereafter) are disposed in the same cell matrix based on a bit-line sense amplifier disposed in a core region of a semiconductor memory device. Therefore, the same noise is reflected into the driving bit line and the reference bit line, and the noises are offset by each other. Through the offset operation, the folded bit-line structure may secure stable operations against the noise.

On the other hand, the open bit-line structure is a structure where a driving bit line and a reference bit line are disposed in different cell matrices based on a bit-line sense amplifier. Therefore, since the noise occurring in the driving bit line and the noise occurring in the reference bit line are different, the open bit-line structure is sensitive to noise. However, in case of the folded bit-line structure, a unit memory cell is designed in $8F^2$, while the unit memory cell is designed in $6F^2$ in the open bit-line structure. The structure of a unit memory cell is a major factor for deciding the size of a semiconductor memory device, and in terms of the same data storing capacity, a semiconductor memory device of the open bit-line structure may be designed smaller than a semiconductor memory device of the folded bit-line structure. Therefore, semiconductor memory devices are designed to have the open bit-line structure these days to realize highly integrated semiconductor memory devices.

Hereafter, the features of the present invention are described in reference to a semiconductor memory device employing the open bit-line structure. However, the present invention is not limited to open bit line structure semiconductor devices. It will become obvious to those skilled in the art to which the present invention pertains that the present invention may be equally applied to a semiconductor memory device having the folded bit-line structure.

Referring now to FIG. 1, a semiconductor memory device is illustrated which includes a first memory cell matrix 10, a plurality of first word line drivers 20 for activating word lines WL disposed in the first cell matrix 10, a second memory cell matrix 30, a plurality of second word line drivers 40 for activating word lines WL disposed in the second memory cell matrix 30, and first and second sense amplifiers 50 and 60. The first sense amplifier is disposed between the first memory cell matrix 10 and the second memory cell matrix 30. Subsequently, a third memory cell matrix (not shown) having the same structure as that of the first memory cell matrix 10 may be disposed under the second memory cell matrix 30, with the second sense amplifier 60 being disposed between the second and third memory cell matrices. The first sense amplifier 50 disposed between the first cell matrix 10 and the second memory cell matrix 30 is shared by the bit lines disposed in the first cell matrix 10 and the bit lines disposed in the second memory cell matrix 30, and senses and amplifies the data transferred through the bit lines disposed in the first and second cell matrices 10 and 30.

For example, when the first word line drivers 20 that control the word lines WL of the first cell matrix 10 activate a predetermined word line WL, a data is transferred to a bit line A that is disposed in the first cell matrix 10 and coupled to the first sense amplifier 50. In other words, the bit line A becomes a driving bit line, and a bit line B that is disposed in the second memory cell matrix 30 and coupled to the first sense amplifier 50 becomes a reference bit line. Herein, the second word line drivers 40 that control the word lines WL of the second memory cell matrix 30 may deactivate all the corresponding word lines WL. Subsequently, the first sense amplifier 50 senses the data transferred through the bit line A and a voltage level of the bit line B, and performs an amplification operation. The sensing and amplification operations may be performed to data transferred through the bit line B with the bit line A as the reference bit line and the bit line B as the driving bit line.

The memory cell matrices, the word line drivers, and the sense amplifiers may be disposed in the core array region.

Hereafter, a configuration of a semiconductor memory device is described with reference to FIG. 2.

Figure 2:
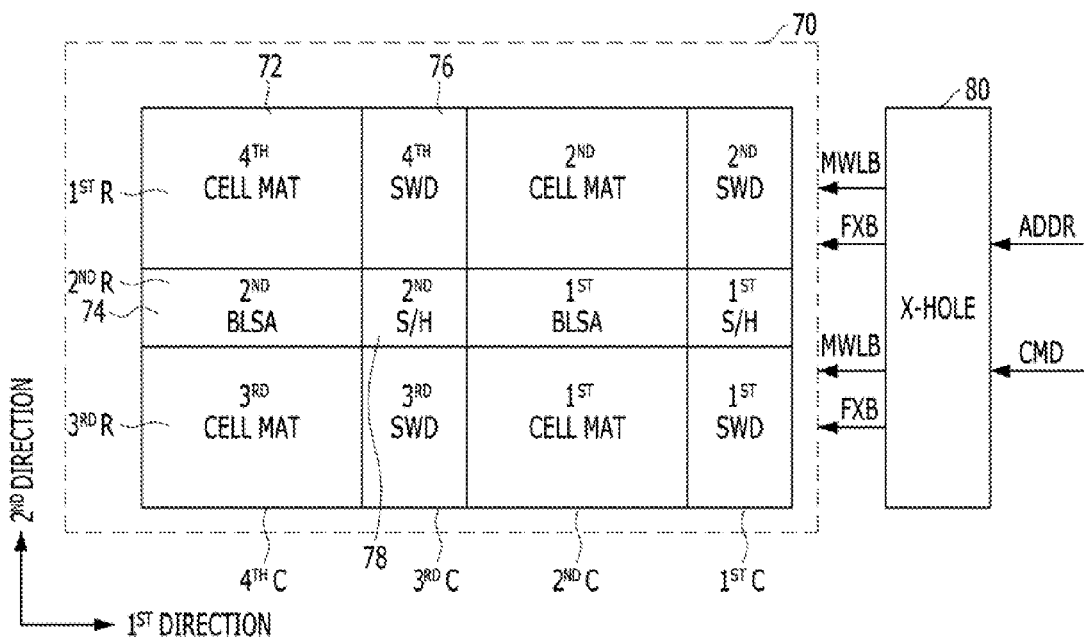
FIG. 2 illustrates a configuration of a semiconductor memory device.

Referring to FIG. 2, the semiconductor memory device includes a core array region 70 and an X-hole region 80.

The core array region is divided into 12 smaller regions arranged in three rows $1^{st}$ R, $2^{nd}$ R and $3^{rd}$ R, extending in a first direction and four columns $1^{st}$ C, $2^{nd}$ C, $3^{rd}$ C, and $4^{th}$ C, extending in a second direction. The second direction may be perpendicular to the first direction as illustrated in FIG. 2. However, the invention is not limited in this way.

More specifically, the core array region 70, includes a center row $2^{nd}$ R which includes a pair of bit-line sense amplifying regions $1^{st}$ BLSA 74 and $2^{nd}$ BLSA and a pair of sub-hole regions $1^{st}$ S/H 78 AND $2^{nd}$ S/H 78 alternately disposed along the first direction. The core array region 70, also includes two side rows $1^{st}$ R and $3^{rd}$ R extending along the first direction on either side of the center row $2^{nd}$ R. Each side row $2^{nd}$ R and $3^{rd}$ R includes a pair of a cell matrix CELL MAT 72 regions and a pair of sub-word line driver regions SWD 76 which are alternately disposed along the first direction on either side of the center row.

The aforementioned regions are arranged in four columns. A firs column $1^{st}$ C that is closer to the X-hole region 80, includes first and second word line driver regions $1^{st}$ SWD 76 and $2^{nd}$ SWD 76, and a first sub-hole region $1^{st}$ S/H 78 positioned between the first and second word line driver regions $1^{st}$ SWD 76 and $2^{nd}$ SWD 76. A second column $2^{nd}$ C, next to the first column $1^{st}$ C, includes first and second cell matrix regions $1^{st}$ CELL MAT and $2^{nd}$ CELL MAT, and a first bit-line sense amplifying region $1^{st}$ BLSA 74 positioned between the first and second cell matrix regions $1^{ST}$ CELL MAT, $2^{nd}$ CELL MAT. A third column $3^{rd}$ C, next to the second column $2^{nd}$ C, includes third and fourth word line driver regions $3^{rd}$ SWD 76 and $4^{th}$ SWD 76 and a second sub-hole region $2^{nd}$ S/H 78 positioned between the third and fourth word line driver regions $3^{rd}$ SWD 76 and $4^{th}$ SWD 76. A fourth column $4^{th}$ C, next to the third column, includes third and fourth cell matrices $3^{rd}$ CELL MAT 72 and $4^{th}$ CELL MAT 72 and a second bit-line sense amplifying region $2^{nd}$ BLSA 74 positioned between the third and fourth cell matrices $3^{rd}$ CELL MAT 72 and $4^{th}$ CELL MAT 72.

The bit-line sense amplifying regions BLSA 74 may amplify the data of bit line pairs (not shown) of the cell matrices 72, and receive a driving voltage. The cell matrices 72 represent a memory cell array where memory cells are regularly arranged, and the cell matrices 72 may have different structures according to how the semiconductor memory device is designed. The sub-word line driver regions SWD 76 are coupled to the word lines WL of the memory cells of the cell matrices 72 and provide them with driving signals.

The elements of the core array region 70 may operate by a main word line driving signal MWLB and a local word line driving signal FXB that are provided from the X-hole region 80.

The X-hole region 80 may perform different logic operations according to a command signal CMD, and provide particular memory cells in the core array region 70 with driving signals according to an address signal ADDR. The X-hole region 80 may generate and output the main word line driving signal MWLB and the local word line driving signal FXB based on the command signal CMD and the address signal ADDR.

The memory cells included in the core array region 70 may be hierarchically coupled to main word lines and a plurality of sub-word lines coupled to the respective main word lines. The sub-word line driver regions SWD 76 may provide the particular memory cell with a driving signal according to the main word line driving signal MWLB and the local word line driving signal FXB. Therefore, the memory cells included in the core array region 70 may be driven according to the main word line driving signal MWLB and the local word line driving signal FXB.

Figure 3:
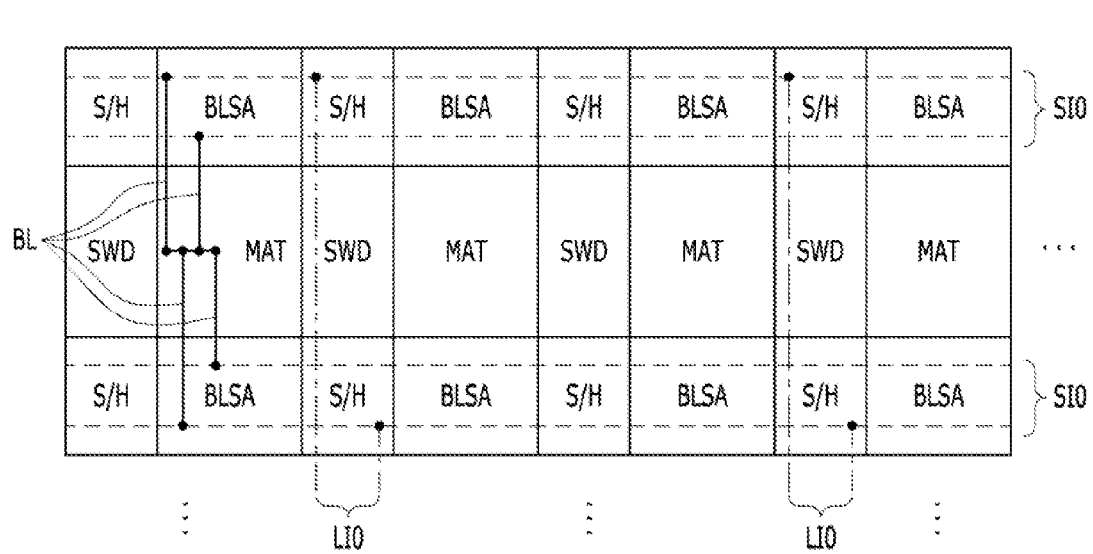
FIG. 3 illustrates data input/output lines according to the configuration of the semiconductor memory device of FIG. 2.

FIG. 3 illustrates data input/output lines according to a configuration of the semiconductor memory device.

FIG. 3 shows a bank 90 including a plurality of cell matrices MAT disposed in the first and second directions.

When an address signal ADDR is applied from a controller (not shown) and a specific word line is activated, the data stored in the memory cells of the respective cell matrices MAT coupled to the activated word line are loaded onto a bit line pair BL, and a bit-line sense amplifier BLSA senses and amplifies a voltage corresponding to the charges (i.e., the data) stored in the memory cells. The data sensed and amplified by the bit-line sense amplifier BLSA are transferred to a segment input/output line pair SIO in response to a column selection signal YI.

A local sense amplifier LSA (not shown) senses and amplifies the data loaded onto the segment input/output line pair SIO and transfers the amplified data to a local input/output line pair LIO. Subsequently, the data transferred to the local input/output line pair LIO are sensed and amplified again by an input/output sense amplifier IOSA (not shown), and the amplified data are transferred to a global input/output line GIO and outputted to an external device (e.g., a host) through an input/output buffer (not shown). The local sense amplifier LSA that couples the segment input/output line pair SIO to the local input/output line pair LIO may be designed to be disposed in the bit-line sense amplifying regions BLSA 74 or the sub-hole regions S/H 78 shown in FIG. 2.

Hereafter, a method in accordance with an embodiment of the present invention for reducing the time taken for a test operation for detecting weak cells in a semiconductor memory device having the above-described structure is described with reference FIG. 4. In an embodiment of the present invention, a test operation may be performed within a short time by simultaneously activating the word lines of cell matrices (which are memory blocks) that do not share a bit line sense amplifier and reading data from the activated word lines.

Figure 4:
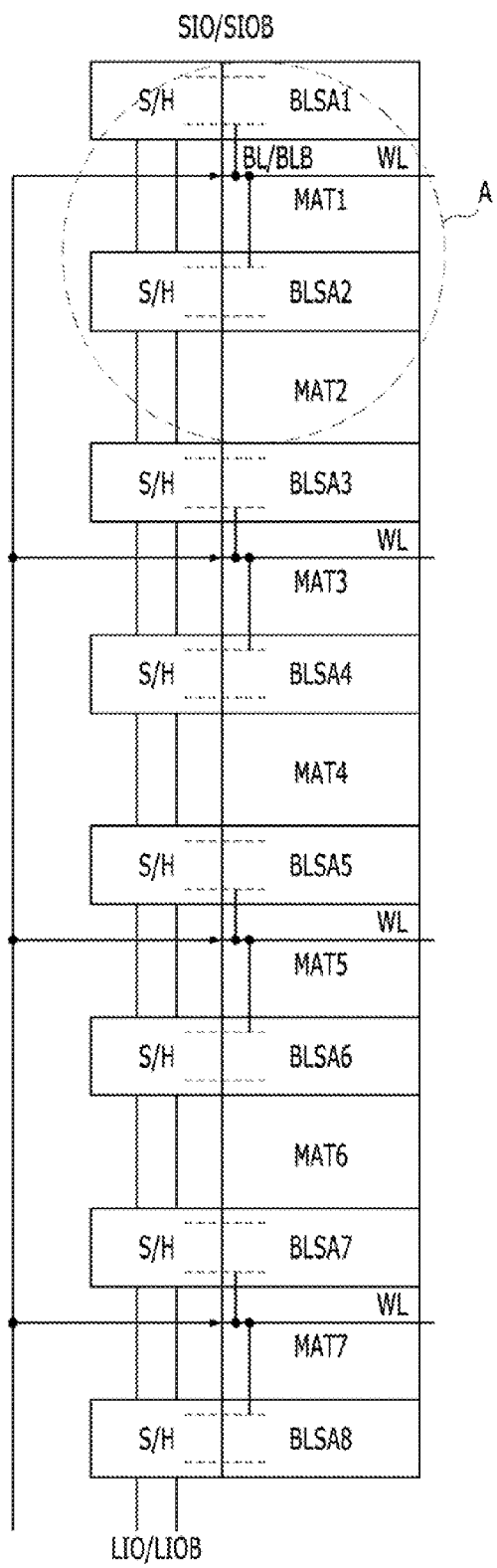
FIG. 4 illustrates a method for testing a semiconductor memory device, in accordance with an embodiment of the present invention.
Figure 5:
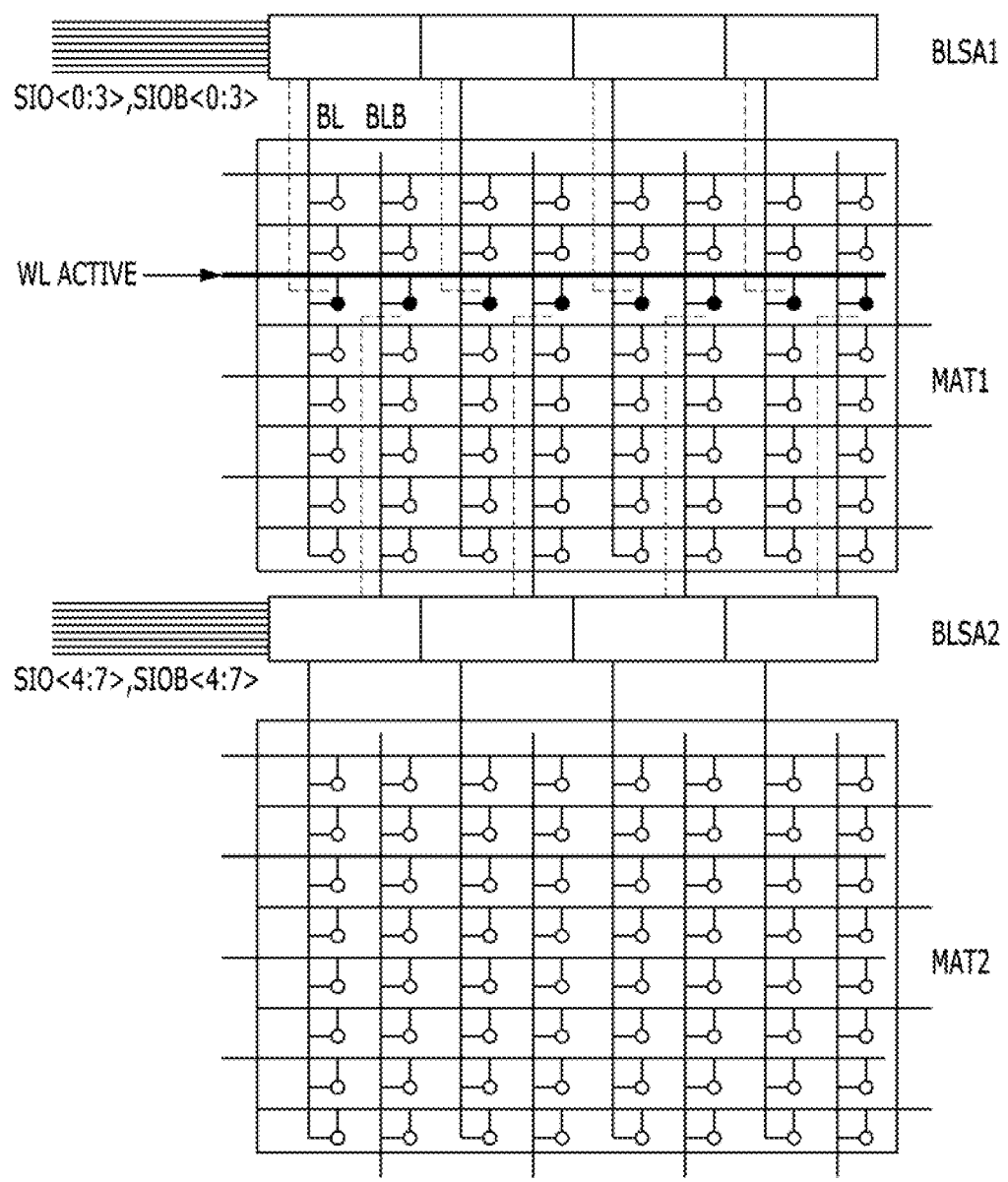
FIG. 5 shows in more detail a portion of FIG. 4.

FIG. 4 illustrates a method for testing a semiconductor memory device, in accordance with an embodiment of the present invention. FIG. 5 shows in more detail a portion A of FIG. 4.

Referring to FIG. 4, a semiconductor memory device in accordance with an embodiment of the present invention may include a plurality of cell matrices MAT1 to MAT7, each of which is a memory block, a plurality of bit-line sense amplifiers BLSA1 to BLSA8, a word line driver (see "20" and "40" of FIG. 1 or "76" of FIG. 2), and a weak cell detection circuit (not shown). The respective bit-line sense amplifiers BLSA1 to BLSA8 are shared by the neighboring cell matrices among the plurality of the cell matrices MAT1 to MAT7, sense and amplify the data that are read through a bit line pair BL and BLB from the memory cells coupled to the neighboring cell matrices through activated word lines WL, and output the amplified data to a plurality of segment input/output line pairs SIO.

In accordance with the illustrated embodiment of the present invention, the word line driver activates the word lines of the cell matrices that do not share the bit-line sense amplifier during a test mode. The weak cell detection circuit compresses the data transferred through the plurality of the segment input/output line pairs SIO and outputs compressed data during the test mode.

FIG. 4 exemplifies seven cell matrices MAT1 to MAT7 and eight bit-line sense amplifiers BLSA1 to BLSA8 shared by the neighboring two cell matrices among the cell matrices MAT1 to MAT7. For example, the second bit-line sense amplifier BLSA2 may be shared by the first cell matrix MAT1 and the second memory cell matrix MAT2, and the third bit-line sense amplifier BLSA3 may be shared by the second memory cell matrix MAT2 and the third cell matrix MAT3. The first bit-line sense amplifier BLSA1 may be coupled to a bit line of a dummy matrix (not shown) disposed in the uppermost portion as well as a bit line of the first cell matrix MAT1, and the eighth bit-line sense amplifier BLSA8 may be coupled to a bit line of a dummy matrix (not shown) disposed in the lowermost portion as well as a bit line of the fifth cell matrix MAT5.

According to an embodiment of the present invention, during the test mode when a test data (e.g., a data of a high logic level) is written in a plurality of memory cells and then the stored data is outputted, the word lines WL of the cell matrices that do not share the bit-line sense amplifiers may be activated simultaneously.

For example, as illustrated in FIG. 4, the word lines WL of the first cell matrix MAT1, the third cell matrix MAT3, the fifth cell matrix MAT5, and the seventh cell matrix MAT7 that do not share the bit-line sense amplifiers may be activated simultaneously. In this case, when the word lines WL of the first cell matrix MAT1, the third cell matrix MAT3, the fifth cell matrix MAT5, and the seventh cell matrix MAT7 are activated, the data of the memory cells that are coupled to the activated word lines WL are transferred to a pair of corresponding bit-line sense amplifiers BLSA1 to BLSA8 disposed in the upper and lower portions of the respective odd-numbered cell matrix MAT1, MAT3, MAT5 and MAT7 through the bit lines BL and BLB. Herein, the word lines WL of the second memory cell matrix MAT2, the fourth cell matrix MAT4, and the sixth cell matrix MAT6 may be all deactivated.

Referring to FIG. 5 illustrating as a part of the semiconductor memory device of FIG. 4, the activated first cell matrix MAT1, the deactivated second memory cell matrix MAT2, and the first and second bit-line sense amplifiers BLSA1 and BLSA2 corresponding to the first cell matrix MAT1, when the word lines WL of the first cell matrix MAT1 are activated, the data of the memory cells that are coupled to the activated word lines WL may be transferred to the first bit-line sense amplifier BLSA1 and the second bit-line sense amplifier BLSA2 through the bit lines BL and BLB. The first bit-line sense amplifier BLSA1 may sense and amplify the data transferred through the bit lines BL, and transfer the amplified data to an upper segment input/output line pair SIO<0:3> and SIOB<0:3> in response to a column selection signal YI. The second bit-line sense amplifier BLSA2 may sense and amplify the data transferred through the bit lines BLB, and transfer the amplified data to a lower segment input/output line pair SIO<4:7> and SIOB<4:7> in response to the column selection signal YI.

As described above, the data of the simultaneously activated odd-numbered cell matrices MAT1, MAT3, MAT5 and MAT7 may be sensed and amplified by the bit-line sense amplifiers BLSA1 to BLSA8 disposed in upper and lower portion of the respective odd-numbered cell matrices MAT1, MAT3, MAT5 and MAT7, and then transferred to the local input/output lines LIO through the upper and lower segment input/output line pairs SIO<0:3> and SIOB<0:3> and SIO<4:7> and SIOB<4:7>.

Substantially the same operation may also be performed to the simultaneously activated even-numbered cell matrices MAT2, MAT4, MAT6 and MAT8 that do not share the bit-line sense amplifiers BLSA1 to BLSA8 while the odd-numbered cell matrices MAT1, MAT3, MAT5 and MAT7 being deactivated.

Subsequently, the weak cell detection circuit may receive the data transferred to the upper segment input/output line pair SIO<0:3> and SIOB<0:3> and the lower segment input/output line pair SIO<4:7> and SIOB<4:7> and detect weak cells. Described hereafter is a weak cell detection circuit for detecting weak cells by compressing the data transferred through the upper segment input/output line pair SIO<0:3> and SIOB<0:3> and lower segment input/output line pair SIO<4:7> and SIOB<4:7> in accordance with embodiments of the present invention with reference to the accompanying drawings.

Figure 6:
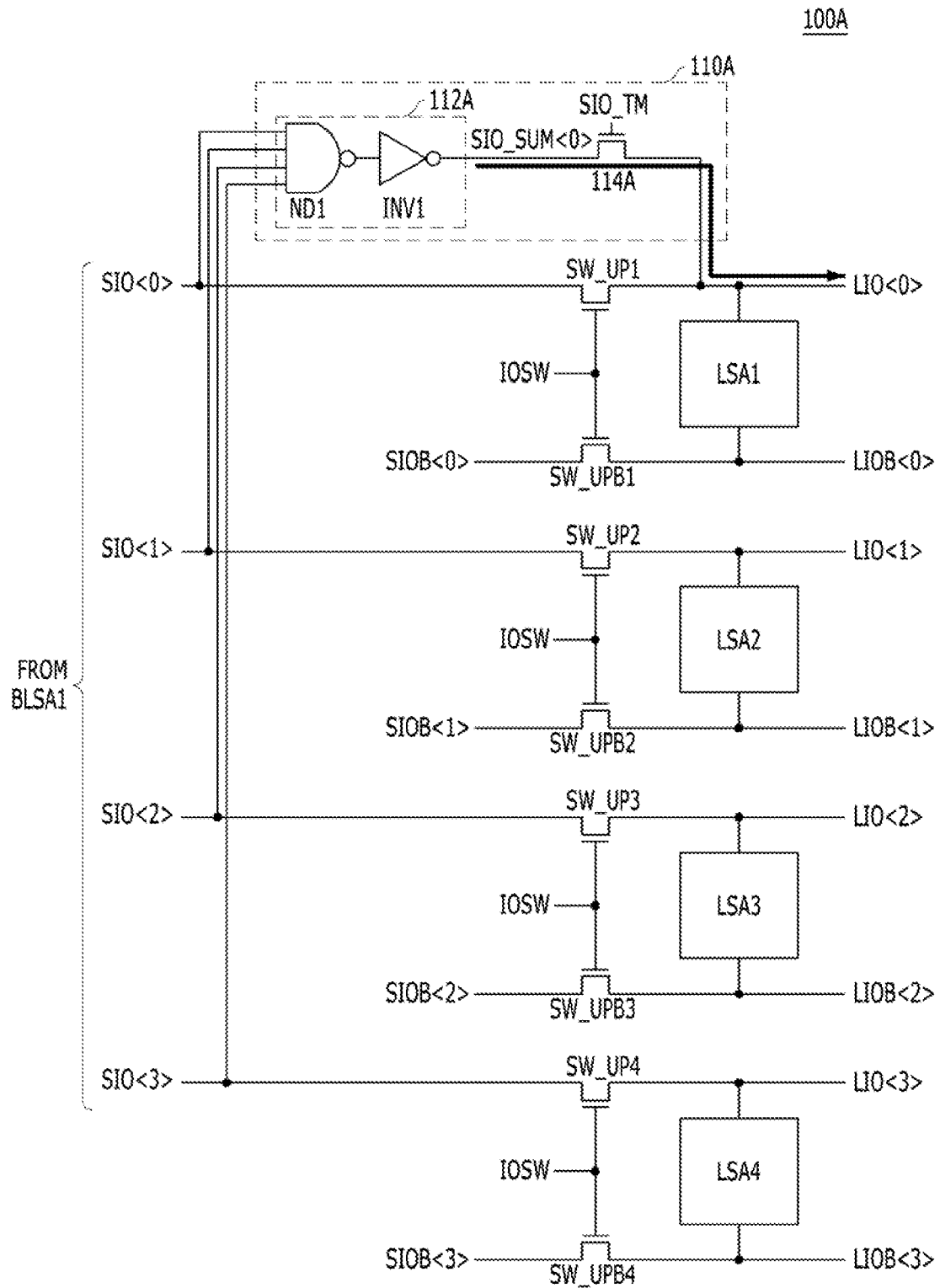
FIG. 6 is a circuit diagram illustrating a weak cell detection circuit in accordance with a first embodiment of the present invention.

FIG. 6 is a circuit diagram illustrating a weak cell detection circuit 100A in accordance with a first embodiment of the present invention.

The weak cell detection circuit 100A in accordance with the first embodiment of the present invention may include a plurality of weak cell detectors 110A that respectively correspond to the plurality of bit-line sense amplifiers BLSA1 to BLSA8. Each of the weak cell detectors 110A may detect weak cells by compressing the data transferred through the corresponding upper and lower segment input/output line pairs SIO<0:3> and SIOB<0:3> and SIO<4:7> and SIOB<4:7> and mapping and outputting the compressed data to one among local input/output lines LIO<0:7>.

FIG. 6 shows the weak cell detector 110A that detects weak cells by compressing the data that is sensed and amplified by corresponding one (e.g., the first bit-line sense amplifier BLSA1) of the odd-numbered bit-line sense amplifiers BLSA1, BLSA3, BLSA5 and BLSA7 and transferred through the upper segment input/output line pair SIO<0:3> and SIOB<0:3>. The weak cell detector 110A corresponding to the lower segment input/output line pair SIO<4:7> and SIOB<4:7> or to the even-numbered bit-line sense amplifiers BLSA2, BLSA4, and BLSA6 may be the same as the weak cell detector 110A except for the upper and lower segment input/output line pairs SIO<0:3> and SIOB<0:3> and SIO<4:7> and SIOB<4:7>. As described above with reference to FIGS. 4 and 5, the odd-numbered bit-line sense amplifiers BLSA1, BLSA3, BLSA5 and BLSA7 and the even-numbered bit-line sense amplifiers BLSA2, BLSA4, and BLSA6 may be disposed in upper and lower portion of the simultaneously activated odd-numbered cell matrices MAT1, MAT3, MAT5 and MAT7 that do not share the bit-line sense amplifiers BLSA1 to BLSA8.

Referring to FIG. 6, the weak cell detector 110A may include a first data compression unit 112A and a first local line mapping unit 114A. The weak cell detector 110A may be disposed in the sub-hole region S/H 78 of FIG. 2.

The first data compression unit 112A may compress a data transferred to the upper segment input/output line SIO<0:3> and output a first compressed data SIO_SUM<0>, which corresponds to the first bit-line sense amplifier BLSA1. The weak cell detectors 110A respectively corresponding to the other odd-numbered bit-line sense amplifiers BLSA3, BLSA5 and BLSA7 or corresponding to the upper segment input/output line pair SIO<0:3> and SIOB<0:3> may output a plurality of compressed data SIO_SUM<1> to SIO_SUM<3>. The weak cell detectors 110A respectively corresponding to the even-numbered bit-line sense amplifiers BLSA2, BLSA4, and BLSA6 or corresponding to the lower segment input/output line pair SIO<4:7> and SIOB<4:7> may output a plurality of compressed data SIO_SUM<4> to SIO_SUM<7>. The first data compression unit 112A includes a NAND gate ND1 that receives the data transferred through the upper segment input/output line SIO<0:3> and performs an AND operation and an inverter INV1. When any one of the transferred data has a low logic level, the first data compression unit 112A may output the first compressed data SIO_SUM<0> having a low logic level thereby informing one or more weak cells included in the corresponding cell matrix. The first local line mapping unit 114A may be turned on during a test mode, and may map the first compressed data SIO_SUM<0> outputted from the first data compression unit 112A to one (e.g., the first local input/output line LIO<0>) among upper local input/output lines LIO<0:3>. The weak cell detectors 110A corresponding to the bit-line sense amplifiers BLSA1 to BLSA8 may map the compressed data SIO_SUM<0> to SIO_SUM<7> to the upper and lower local input/output line pairs LIO<0:3> and LIOB<0:3> and LIO<4:7> and LIOB<4:7>, respectively, which will be described later with reference to FIG. 7.

When an input/output control signal IOSW is enabled during a normal mode, first normal input/output switches SW_UP1 to SW_UP4 and second normal input/output switches SW_UPB1 to SW_UPB4 may be turned on, and first to fourth local sense amplifiers LSA1 to LSA4 may sense and amplify the data transferred through the upper segment input/output line pair SIO<0:3> and SIOB<0:3> and transfer the amplified data to the upper local input/output line pair LIO<0:3> and LIOB<0:3>. For example, when the input/output control signal IOSW is enabled, the first normal input/output switch SW_UP1 and the second normal input/output switch SW_UPB1 may be turned on, and the first local sense amplifier LSA1 may sense and amplify the data transferred through the upper segment input/output line pair SIO<0> and SIOB<0> and transfer the amplified data to the upper local input/output line pair LIO<0> and LIOB<0>.

When a test mode signal SIO_TM is enabled in a test mode, the first data compression unit 112A may receive the data transferred through the upper segment input/output lines SIO<0:3> and output the first compressed data SIO_SUM<0> having a high logic level or a low logic level according to whether one or more weak cells are included in the corresponding cell matrix. The first local line mapping unit 114A then may be turned on, and may map the first compressed data SIO_SUM<0> to one (e.g., the first local input/output line LIO<0>) among the upper local input/output lines LIO<0:3>.

In this embodiment of the present invention, during the test mode, the first to fourth local sense amplifiers LSA1 to LSA4 may be deactivated and may not operate in order not to amplify the first compressed data SIO_SUM<0>.

Figure 7:
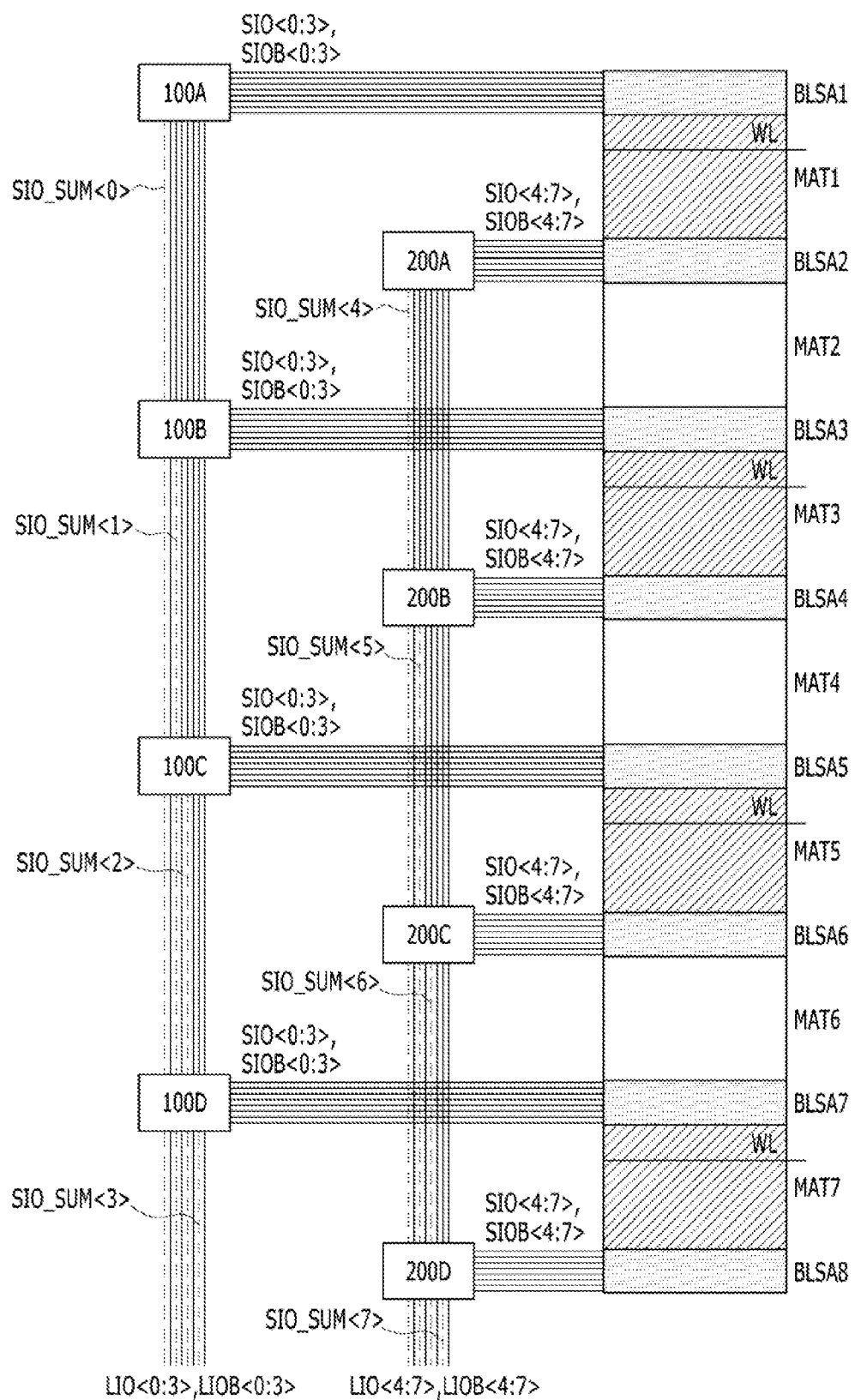
FIG. 7 illustrates a semiconductor memory device including the weak cell detection circuit of FIG. 6.

FIG. 7 illustrates a semiconductor memory device including the weak cell detection circuits 100A to 200D each including the weak cell detection circuit 110A described with reference to FIG. 6. The weak cell detection circuits 100A to 100D correspond to the odd-numbered bit-line sense amplifiers BLSA1, BLSA3, BLSA5 and BLSA7 or to the upper segment input/output line pair SIO<0:3> and SIOB<0:3>, and may output the plurality of compressed data SIO_SUM<1> to SIO_SUM<3> to the upper local input/output line pair LIO<0:3> and LIOB<0:3>, respectively. The weak cell detection circuits 200A to 200D correspond to the even-numbered bit-line sense amplifiers BLSA2, BLSA4, and BLSA6 or to the lower segment input/output line pair SIO<4:7> and SIOB<4:7>, and may output the plurality of compressed data SIO_SUM<4> to SIO_SUM<7> to the lower local input/output line pair LIO<4:7> and LIOB<4:7>, respectively. As described above with reference to FIGS. 4 and 5, the odd-numbered bit-line sense amplifiers BLSA1, BLSA3, BLSA5 and BLSA7 and the even-numbered bit-line sense amplifiers BLSA2, BLSA4, and BLSA6 may be disposed in upper and lower portion of the simultaneously activated odd-numbered cell matrices MAT1, MAT3, MAT5 and MAT7 that do not share the bit-line sense amplifiers BLSA1 to BLSA8.

Referring to FIG. 7, during the test mode, the weak cell detection circuits 100A to 200D may map and transfer the compressed data SIO_SUM<0> to SIO_SUM<7> to the upper and lower local input/output line pairs LIO<0:3> and LIOB<0:3> and LIO<4:7> and LIOB<4:7>, respectively, based on the data transferred from the corresponding cell matrix through the upper and lower segment input/output line pairs SIO<0:3> and SIOB<0:3> and SIO<4:7> and SIOB<4:7>.

For example, the weak cell detection circuit 200B may map and transfer the sixth compressed data SIO_SUM<5> representing the data that is sensed and amplified by the fourth bit-line sense amplifier BLSA4 and transferred through the lower segment input/output line SIO<4:7> to the sixth upper local input/output line LIO<5>.

As described above, the weak cell detection circuit in accordance with the first embodiment of the present invention may map and output the compressed data SIO_SUM<0:7>, which informs the presence of weak cells, to the local input/output lines LIO<0:7> by using the existing segment input/output line pair SIO<0:7> and SIOB<0:7> and the local input/output line pair LIO<0:7> and LIOB<0:7>. Therefore, the semiconductor memory device including the weak cell detection circuit may detect weak cells by using existing data lines without any additional data line added thereto. Moreover, since weak cell information on the memory cells that are coupled to the simultaneously activated word lines may be obtained for each cell matrix based on the data transferred through the local input/output lines LIO<0:7>, it is possible to accurately detect weak cells and thereby improve chip reliability.

The above-described configuration is an example of the present invention. It should be apparent to those skilled in the art to which the present invention pertains that the present invention is not limited to it.

Figure 8:
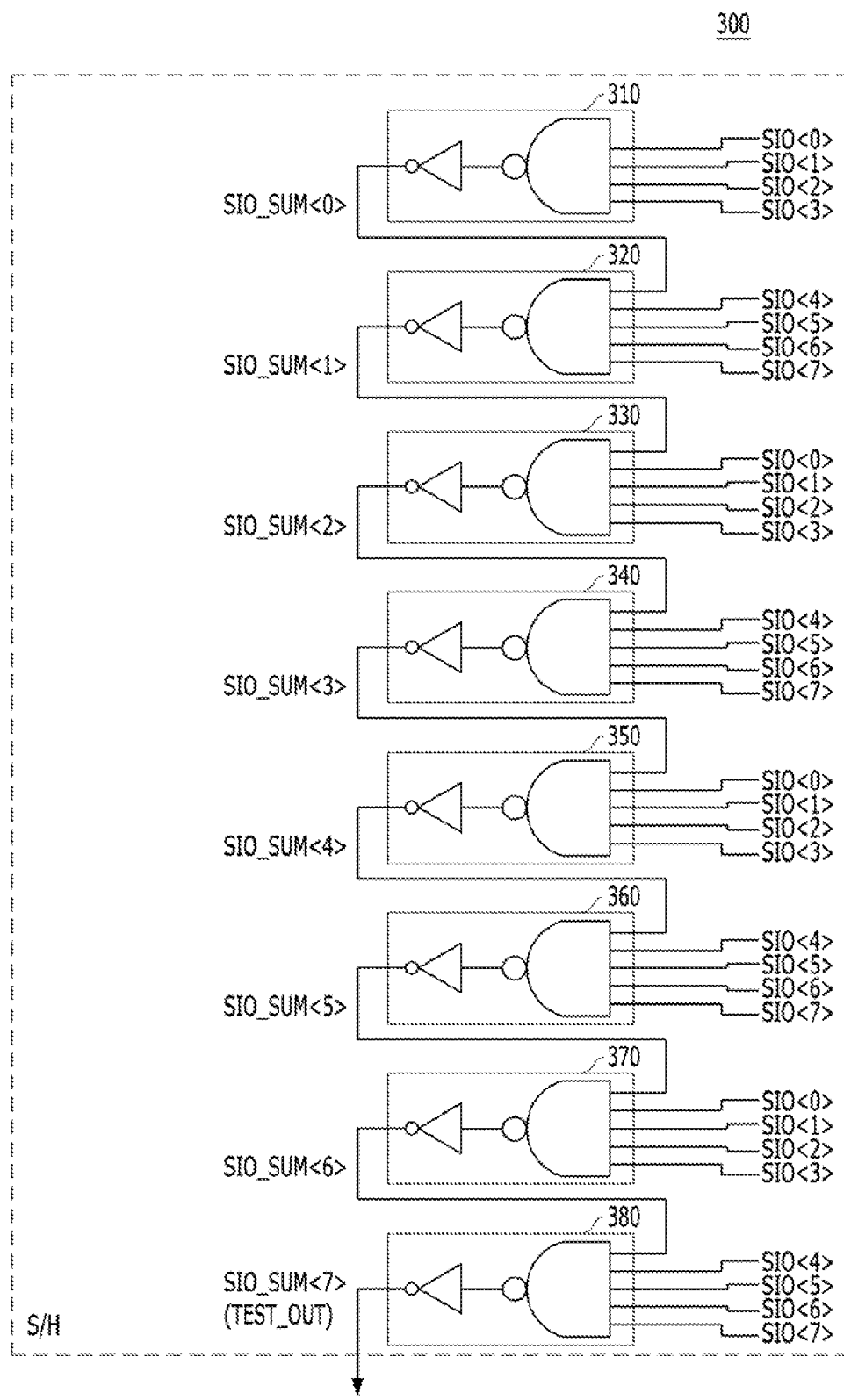
FIG. 8 is a circuit diagram illustrating a weak cell detection circuit, in accordance with a second embodiment of the present invention.

FIG. 8 is a circuit diagram illustrating a weak cell detection circuit 300, in accordance with a second embodiment of the present invention.

Referring to FIG. 8, the weak cell detection circuit 300 may include a plurality of data compression units 310 to 380 that correspond to a plurality of bit-line sense amplifiers BLSA1 to BLSA8, respectively. The plurality of data compression units 310 to 380 may be serially coupled to each other, and the last one of the plurality of data compression units 310 to 380 (e.g., the eighth data compression unit 380) may output corresponding compressed data SIO_SUM<7> to the last lower local input/output line pair LIO<7> and LIOB<7> as a final test result TEST_OUT.

The respective data compression units 310 to 380 may receive data provided from the corresponding upper and lower segment input/output line pairs SIO<0:3> and SIOB<0:3> and SIO<4:7> and SIOB<4:7>. Further, the respective data compression units 310 to 380 may receive compressed data provided from the serially coupled data compression unit of the previous stage, except for the firstly disposed data compression unit (e.g., the first data compression unit 310 of FIG. 8). The data compression units 310 to 380 may compress the provided data, and output the compressed data SIO_SUM<0> to SIO_SUM<7> to the serially coupled data compression unit of the next stage, respectively, except for the lastly disposed data compression unit (e.g., the eighth data compression unit 380 of FIG. 8). For example, the second data compression unit 320 may compress data provided from the lower segment input/output lines SIO<4:7> with the first compressed data SIO_SUM<0> provided from the first data compression unit 310 of the previous stage together for generating and output the second compressed data SIO_SUM<1> to the third data compression unit 330 of the next stage.

Meanwhile, although FIG. 8 shows that the second to eighth data compression units 320 to 380 receive the compressed data SIO_SUM<0:6> outputted from the data compression unit of the previous stage, which is right ahead of the corresponding data compression unit. However, it is obvious to those skilled in the art that the scope of the present invention is not limited to it. For example, the first to eighth data compression units 310 to 380 may receive a data that is transferred through a corresponding line among the upper segment input/output lines SIO<0:3> or the lower segment input/output lines SIO<4:7> with a compressed data that is outputted from one among the other data compression units 310 to 380 except the corresponding data compression unit, and compress the two data together, and output the final test result TEST_OUT.

As described above, the weak cell detection circuit 300 in accordance with the second embodiment of the present invention may receive data by simultaneously activating the word lines of cell matrices that do not share the bit-line sense amplifiers through the segment input/output lines SIO<0:7>, compress the data, and output the final test result TEST_OUT. Herein, since the first to eighth data compression units 310 to 380 of the weak cell detection circuit 300 is disposed in a sub-hole S/H, the weak cell detection circuit 300 may perform a test operation at a high speed and detect weak cells by adding a minimal number of a data line, which is a data line for outputting the final test result TEST_OUT.

Figure 9:
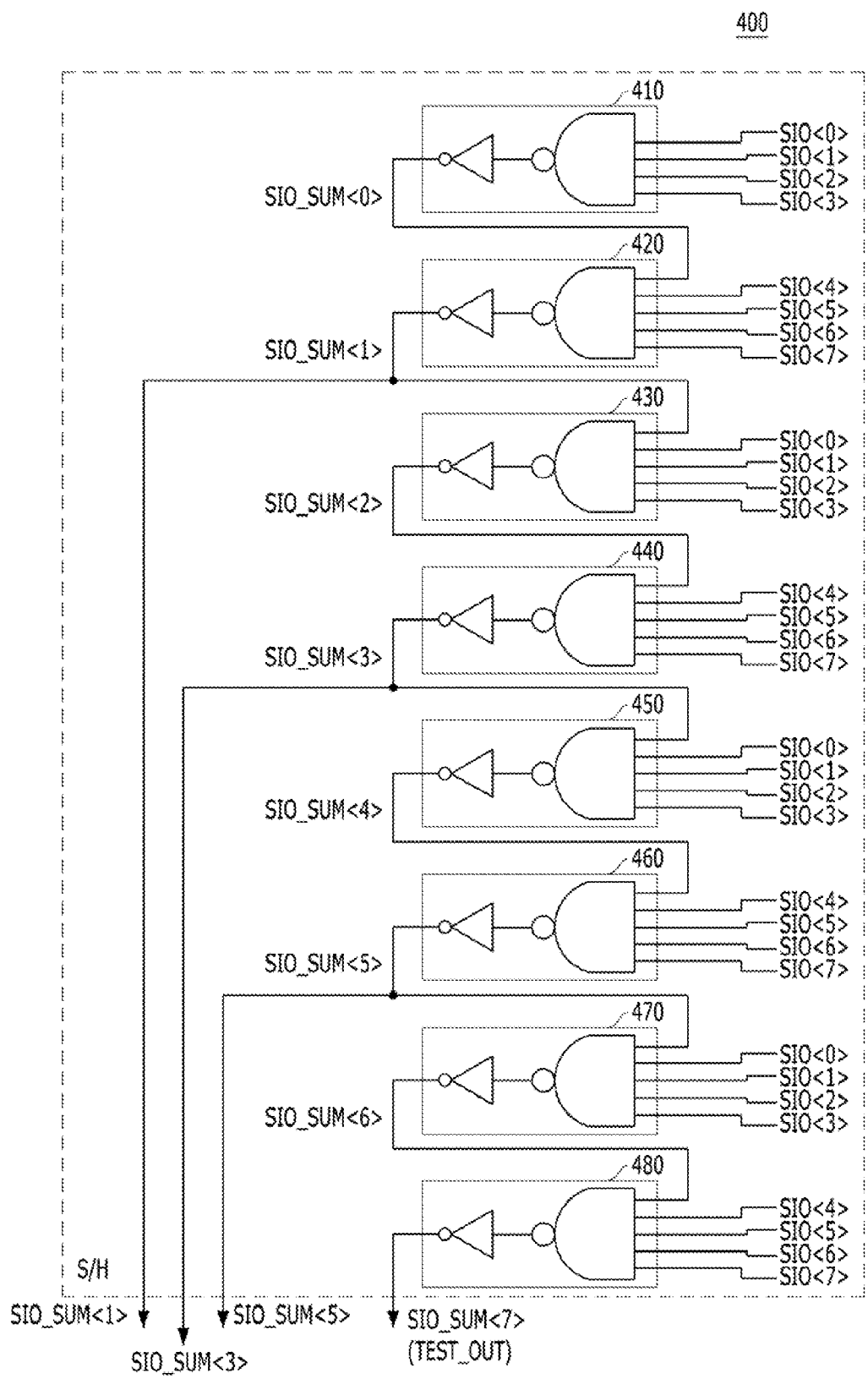
FIG. 9 is a circuit diagram illustrating a weak cell detection circuit, in accordance with a third embodiment of the present invention.

FIG. 9 is a circuit diagram illustrating a weak cell detection circuit 400, in accordance with a third embodiment of the present invention.

Referring to FIG. 9, the weak cell detection circuit 400 may include a plurality of data compression units 410 to 480 that correspond to a plurality of bit-line sense amplifiers BLSA1 to BLSA8, respectively. The plurality of data compression units 410 to 480 may be serially coupled to each other, and the last one of the plurality of data compression units 410 to 480 (e.g., the eighth data compression unit 480) may output corresponding compressed data SIO_SUM<7> to the last lower local input/output line pair LIO<7> and LIOB<7> as a final test result TEST_OUT.

The second to eighth data compression units 420 to 480 may compress a data transferred through a corresponding line among upper segment input/output lines SIO<0:3> or lower segment input/output lines SIO<4:7> with a compressed data outputted from the data compression unit of the previous stage together so as to generate a compressed data SIO_SUM<1:7> of the corresponding stage, and output the compressed data SIO_SUM<1:7>. Also, the weak cell detection circuit 400 may additionally output a compressed data for each cell matrix. In other words, the weak cell detection circuit 400 may additionally output the compressed data SIO_SUM<1>, SIO_SUM<3> and SIO_SUM<5>. Therefore, when the final test result TEST_OUT informs the presence of weak cells, the weak cell detection circuit 400 may detect which of the cell matrices includes the weak cells based on the compressed data SIO_SUM<1>, SIO_SUM<3> and SIO_SUM<5> that are read out together.

Meanwhile, although FIG. 9 shows that weak cell information for each cell matrix is extracted by grouping the compressed data SIO_SUM<0:6> by two. However, it is obvious to those skilled in the art that the scope of the present invention is not limited to it. For example, the first to eighth data compression units 410 to 480 may be grouped into a predetermined number according to the kind of information needed, and a compressed data may be additionally generated for each group of the data compression units. Also, although FIG. 9 shows that the first to eighth data compression units 410 to 480 receive the compressed data SIO_SUM<0:6> outputted from the data compression unit of the previous stage, which is right ahead of the corresponding data compression unit. However, it is obvious to those skilled in the art that the scope of the present invention is not limited to it. For example, the first to eighth data compression units 410 to 480 may receive the compressed data SIO_SUM<0:7> that is outputted from one among the other data compression units 410 to 480 except the corresponding data compression unit.

As described above, the weak cell detection circuit 400 in accordance with the third embodiment of the present invention may receive data by simultaneously activating the word lines of cell matrices that do not share the bit-line sense amplifiers through the segment input/output lines SIO<0:7>, compress the data, and output the final test result TEST_OUT. Herein, if the final test result TEST_OUT informs the presence of weak cells, some of the compressed data SIO_SUM<0:7> may be read out together and weak cell information for each cell matrix may be extracted. Therefore, the weak cell detection circuit 400 may accurately detect the weak cells only by performing a test operation at a high speed, thus improving chip reliability.

Figure 10:
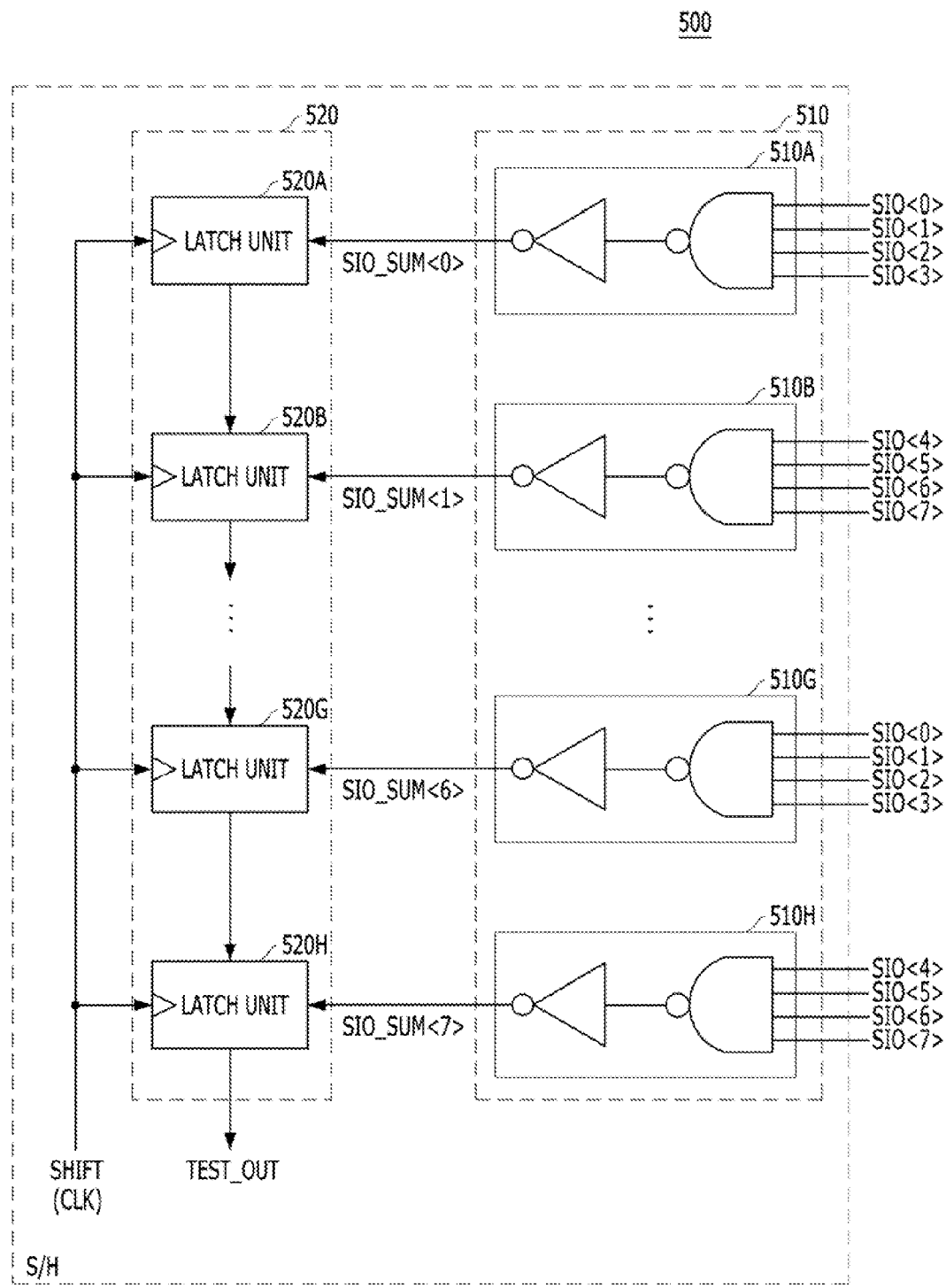
FIG. 10 is a circuit diagram illustrating a weak cell detection circuit, in accordance with a fourth embodiment of the present invention.

FIG. 10 is a circuit diagram illustrating a weak cell detection circuit 500, in accordance with a fourth embodiment of the present invention.

Referring to FIG. 10, the weak cell detection circuit 500 may include a data compressor 510 and a shift register 520.

The data compressor 510 may include a plurality of data compression units 510A to 510H that correspond to a plurality of bit-line sense amplifiers BLSA1 to BLSA8, respectively. The plurality of data compression units 510A to 510H may compress data transferred through corresponding lines among upper and lower segment input/output lines SIO<0:3> and SIO<4:7> for generating and output the compressed data SIO_SUM<0:7>. The plurality of data compression units 510A to 510H may be the same as the plurality of data compression units 310 to 380 of FIG. 8 except that the plurality of data compression units 510A to 510H are not serially coupled to each other, and thus the plurality of data compression units 510A to 510H do not receive compressed data provided from the serially coupled data compression unit of the previous stage and do not output the compressed data SIO_SUM<0> to SIO_SUM<7> to the serially coupled data compression unit of the next stage.

The shift register 520 may include a plurality of latch units 520A to 520H that correspond to the plurality of data compression units 510A to 510H, respectively. The latch units 520A to 520H may receive corresponding compressed data among compressed data SIO_SUM<0:7>, store the received compressed data SIO_SUM<0:7> simultaneously, and output the latched signals to the latch units of the next stages in response to a shift signal SHIFT, e.g., a clock signal CLK. Therefore, the shift register 520 may sequentially output weak cell information on the memory cells of the simultaneously activated cell matrices, which do not share the bit-line sense amplifiers whenever the shift signal SHIFT is inputted.

As described above, the weak cell detection circuit 500, in accordance with the fourth embodiment of the present invention, may receive data that are read by simultaneously activating the word lines of cell matrices that do not share bit-line sense amplifiers through segment input/output lines SIO<0:7>, may compress the received data, and may output the compressed data SIO_SUM<0:7>. Herein, with the shift register 520, the weak cell detection circuit 500 may sequentially output the compressed data SIO_SUM<0:7> whenever the shift signal SHIFT is inputted. Therefore, the weak cell Information on the memory cells that are coupled to the simultaneously activated word lines may be obtained, which makes it possible to accurately detect weak cells and improve chip reliability.

FIG. 10 exemplifies both of the data compressor 510 and the shift register 520 in the weak cell detection circuit 500 disposed in sub-hole regions S/H (i.e., the sub-hole regions S/H 78 of FIG. 2) in the layout of a semiconductor memory device. In another embodiment, the data compressor 510 and the shift register 520 may be differently disposed in the layout of a semiconductor memory device. For example, the data compressor 510 may be disposed to the sub-hole regions S/H while the shift register 520 being disposed in the X-hole region 80 of FIG. 2.

Figure 11:
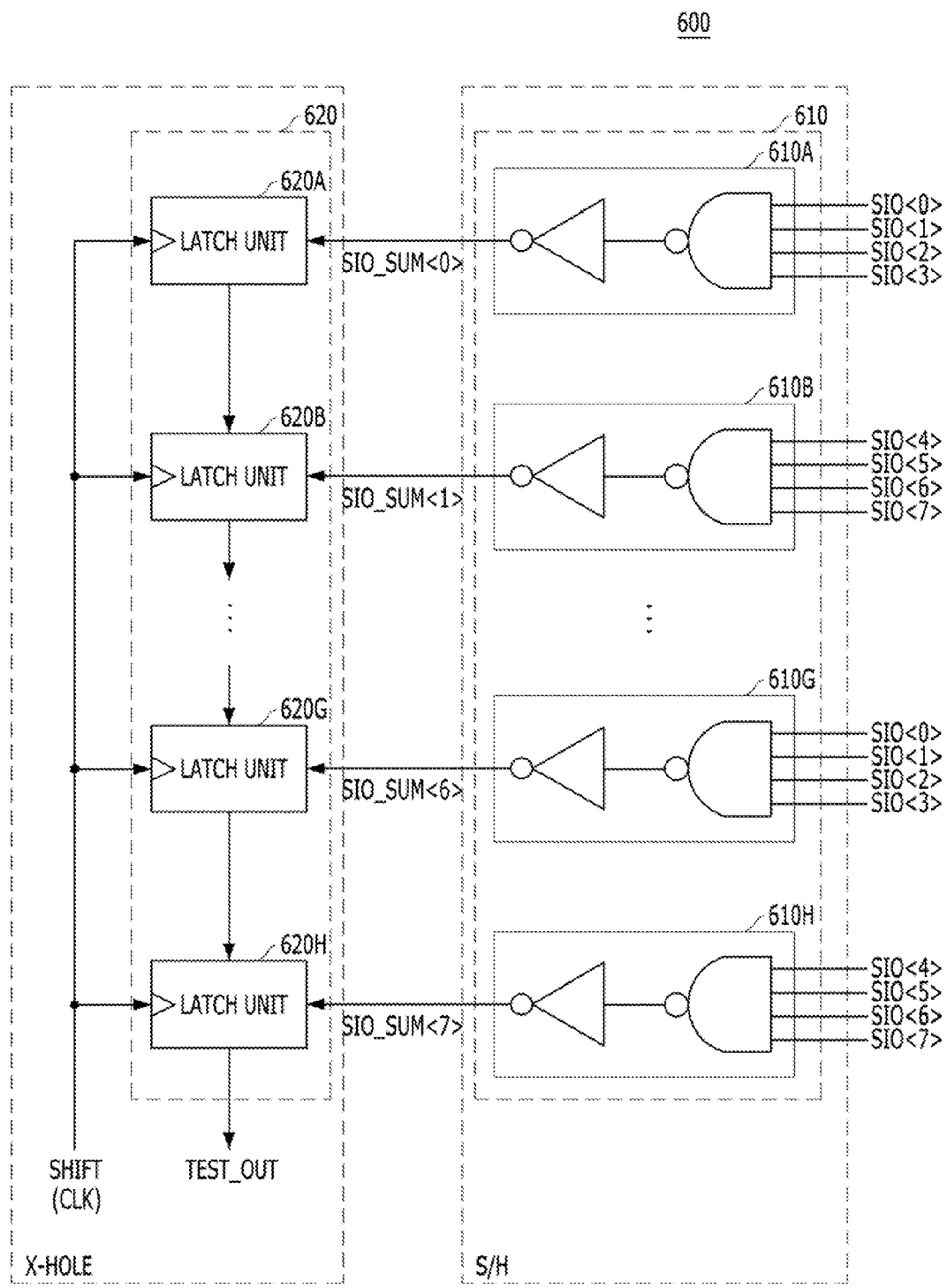
FIG. 11 is a circuit diagram illustrating a weak cell detection circuit, in accordance with a fifth embodiment of the present invention.

FIG. 11 is a circuit diagram illustrating a weak cell detection circuit 600, in accordance with a fifth embodiment of the present invention.

Referring to FIG. 11, the structure of the weak cell detection circuit 600 is substantially the same as that of the weak cell detection circuit 500 shown in FIG. 10. In short, the weak cell detection circuit 600 includes a data compressor 610 and a shift register 620. The data compressor 610 may include first to eighth data compression units 610A to 610H that correspond to a plurality of bit-line sense amplifiers, respectively. The shift register 620 may include a plurality of latch units 620A to 620H that respectively correspond to the first to eighth data compression units 610A to 610H one-on-one. If there is any difference, the shift register 620 may be disposed in an X-hole region X-HOLE (see "80" of FIG. 2), while the data compressor 610 of the weak cell detection circuit 600 in accordance with the fifth embodiment of the present invention is disposed in the sub-hole region S/H (see "78" of FIG. 2).

In this way, the high device density is relieved, improving area use efficiency.

According to embodiments of the present invention, the time taken for testing devices may be shortened by detecting weak cells based on the data that are read by simultaneously activating the word lines of cell matrices that do not share bit-line sense amplifiers. Also, since the weak cells are detected using an existing scheme without any additional data line added thereto, and chip reliability may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a plurality of memory blocks;
   a plurality of bit-line sense amplifiers shared by neighboring memory blocks among the plurality of the memory blocks, and suitable for sensing and amplifying data read from memory cells coupled to activated word lines through bit lines, and outputting the amplified data through a plurality of segment data lines;
   a word line driver suitable for activating word lines of memory blocks that do not share the bit-line sense amplifiers during a test mode; and
   a weak cell detection circuit suitable for compressing the amplified data transferred through the plurality of the segment data lines for generating compressed data and detecting a weak cell based on the compressed data during the test mode.

2. The semiconductor memory device of claim 1,
   wherein the plurality of the bit-line sense amplifiers are disposed in a first region,
   the weak cell detection circuit is disposed in a second region,
   the plurality of the memory blocks are disposed in a third region,
   the word line driver is disposed are disposed in a fourth region, and
   a pair of the first and second regions and a pair of third and fourth regions are alternately disposed in a first direction.

3. The semiconductor memory device of claim 2, wherein the second region is a sub-hole region.

4. The semiconductor memory device of claim 1,
   wherein the weak cell detection circuit includes a plurality of weak cell detectors that correspond to the plurality of the bit-line sense amplifiers, respectively, and
   each of the plurality of the weak cell detectors compresses a data provided through a corresponding one among the plurality of segment data lines from a corresponding bit-line sense amplifier for generating a compressed data, and transfer the compressed data to a corresponding one among a plurality of local data lines during the test mode.

5. The semiconductor memory device of claim 4, wherein each of the plurality of the weak cell detectors includes:
   a data compression unit suitable for compressing the data transferred through the corresponding segment data line from the corresponding bit-line sense amplifier for generating the compressed data; and
   a local line mapping unit operable during the test mode, and suitable for outputting the compressed data to the corresponding local data line.

6. The semiconductor memory device of claim 1,
   wherein the weak cell detection circuit includes a plurality of data compression units serially coupled to each other, and respectively corresponding to the plurality of the bit-line sense amplifiers, and
   wherein the weak cell detection circuit outputs as a final test result a compressed data from the data compression unit of a final stage among the plurality of data compression units.

7. The semiconductor memory device of claim 6,
   wherein each of the plurality of the data compression units compresses a data provided through a corresponding one among the plurality segment data line from a corresponding bit-line sense amplifier with a compressed data provided from one among the other data compression units for generating a compressed data of its own.

8. The semiconductor memory device of claim 6, wherein one or more weak cell detection circuits corresponding to the memory blocks that do not share the bit-line sense amplifiers further transfer the compressed data of their own to corresponding ones among a plurality of local data lines during the test mode.

9. The semiconductor memory device of claim 1, wherein the weak cell detection circuit includes:
a plurality of data compression units respectively corresponding to the plurality of the bit-line sense amplifiers, each data compression unit being suitable for compressing data provided through a corresponding one among the plurality of segment data lines from a corresponding bit-line sense amplifier for generating a compressed data; and
a shift register suitable for simultaneously storing a plurality of the compressed data provided from the plurality of data compression units, and sequentially outputting the plurality of the compressed data in response to a shift signal.

10. The semiconductor memory device of claim 9, wherein the plurality of the data compression units are disposed in a sub-hole region, and the shift register is disposed in an X-hole region.

11. A semiconductor memory device comprising:
a plurality of memory blocks;
a plurality of bit-line sense amplifiers shared by neighboring memory blocks among the plurality of the memory blocks, and suitable for sensing and amplifying data read from memory cells coupled to activated word lines through bit lines, and outputting the amplified data as first amplified data through a plurality of segment data lines;
a plurality of local sense amplifiers each suitable for sensing and amplifying a corresponding one of the first amplified data transferred through a corresponding one of the plurality of the segment data lines, and outputting the amplified first amplified data as second amplified data through a plurality of local data lines;
a word line driver suitable for activating word lines of memory blocks that do not share the bit-line sense amplifiers during a test mode; and
a plurality of weak cell detectors corresponding to the plurality of the bit-line sense amplifiers, respectively,
wherein each of the plurality of the weak cell detectors compresses the corresponding one of the first amplified data transferred through the corresponding one of the plurality of the segment data lines from a corresponding one of the plurality of bit-line sense amplifiers for generating and output a compressed data to a corresponding one among the plurality of the local data lines during the test mode.

12. The semiconductor memory device of claim 11, wherein the plurality of the bit-line sense amplifiers are disposed in a first region,
the weak cell detection circuit is disposed in a second region,
the plurality of the memory blocks are disposed in a third region,
the word line driver is disposed are disposed in a fourth region, and
a pair of the first and second regions and a pair of third and fourth regions are alternately disposed in a first direction.

13. The semiconductor memory device of claim 12, wherein the second region is a sub-hole region.

14. The semiconductor memory device of claim 11, wherein each of the plurality of the weak cell detectors includes:
a data compression unit suitable for compressing the data transferred through the corresponding segment data line from the corresponding bit-line sense amplifier for generating the compressed data; and
a local line mapping unit operable during the test mode, and suitable for outputting the compressed data to the corresponding local data line.

15. A method for detecting a weak cell in a semiconductor memory device which includes a plurality of memory blocks and a plurality of bit-line sense amplifiers shared by neighboring memory blocks among the plurality of the memory blocks, comprising:
activating word lines of memory blocks that do not share the bit-line sense amplifiers among the plurality of the memory blocks;
sensing and amplifying data transferred from memory cells coupled to the activated word lines through bit lines, and outputting the amplified data through a plurality of segment data lines; and
compressing the amplified data transferred through the plurality of the segment data lines for generating compressed data and detecting a weak cell based on the compressed data.

16. The method of claim 15, wherein the detecting of the weak cell includes outputting the compressed data to a plurality of local data lines.

17. The method of claim 16,
wherein the compressing of the amplified data includes compressing the amplified data transferred from a corresponding one among the plurality of bit-line sense amplifiers through a corresponding one among the segment data lines, and
the outputting of the compressed data includes outputting the compressed data to corresponding one among the plurality of local data lines.

18. The method of claim 15,
wherein the compressing of the amplified data includes compressing a data provided through a corresponding one among the plurality segment data lines from a corresponding bit-line sense amplifier with a compressed data provided from one among the other bit-line sense amplifiers for generating a second compressed data.

19. The method of claim 15,
wherein the compressing of the amplified data includes compressing data provided through a corresponding one among the plurality of segment data lines from a corresponding bit-line sense amplifier for generating a plurality of compressed data and outputting the plurality of the compressed data; and
the outputting of the compressed data includes simultaneously storing the plurality of the compressed data and sequentially outputting the plurality of the compressed data in response to a shift signal.

* * * * *